US010627470B2

United States Patent
Chen et al.

(10) Patent No.: US 10,627,470 B2
(45) Date of Patent: Apr. 21, 2020

(54) SYSTEM AND METHOD FOR LEARNING BASED MAGNETIC RESONANCE FINGERPRINTING

(71) Applicant: Siemens Healthcare GmbH, Erlangen (DE)

(72) Inventors: Xiao Chen, Somerset, NJ (US); Boris Mailhe, Plainsboro, NJ (US); Qiu Wang, Princeton, NJ (US); Shaohua Kevin Zhou, Plainsboro, NJ (US); Yefeng Zheng, Princeton Junction, NJ (US); Xiaoguang Lu, West Windsor, NJ (US); Puneet Sharma, Monmouth Junction, NJ (US); Benjamin L. Odry, West New York, NJ (US); Bogdan Georgescu, Plainsboro, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 569 days.

(21) Appl. No.: 15/372,445

(22) Filed: Dec. 8, 2016

(65) Prior Publication Data
US 2017/0160363 A1 Jun. 8, 2017

Related U.S. Application Data

(60) Provisional application No. 62/264,774, filed on Dec. 8, 2015.

(51) Int. Cl.
*G01R 33/56* (2006.01)
*G06N 3/08* (2006.01)
*G01R 33/50* (2006.01)

(52) U.S. Cl.
CPC ........... *G01R 33/5608* (2013.01); *G06N 3/08* (2013.01); *G01R 33/50* (2013.01)

(58) Field of Classification Search
None
See application file for complete search history.

(56) References Cited

U.S. PATENT DOCUMENTS

| 2015/0302297 A1* | 10/2015 | Griswold | G01R 33/5608 706/23 |
|---|---|---|---|
| 2016/0033604 A1 | 2/2016 | Grodzki et al. | |
| 2016/0061902 A1 | 3/2016 | Grodzki et al. | |
| 2016/0061922 A1 | 3/2016 | Grodzki et al. | |
| 2016/0097830 A1 | 4/2016 | Grodzki et al. | |
| 2016/0139227 A1 | 5/2016 | Grodzki et al. | |

* cited by examiner

*Primary Examiner* — Jermele M Hollington
*Assistant Examiner* — Suresh K Rajaputra

(57) ABSTRACT

A learning-based magnetic resonance fingerprinting (MRF) reconstruction method for reconstructing an MR image of a tissue space in an MR scan subject for a particular MR sequence is disclosed. The method involves using a machine-learning algorithm that has been trained to generate a set of tissue parameters from acquired MR signal evolution without using a dictionary or dictionary matching.

19 Claims, 1 Drawing Sheet

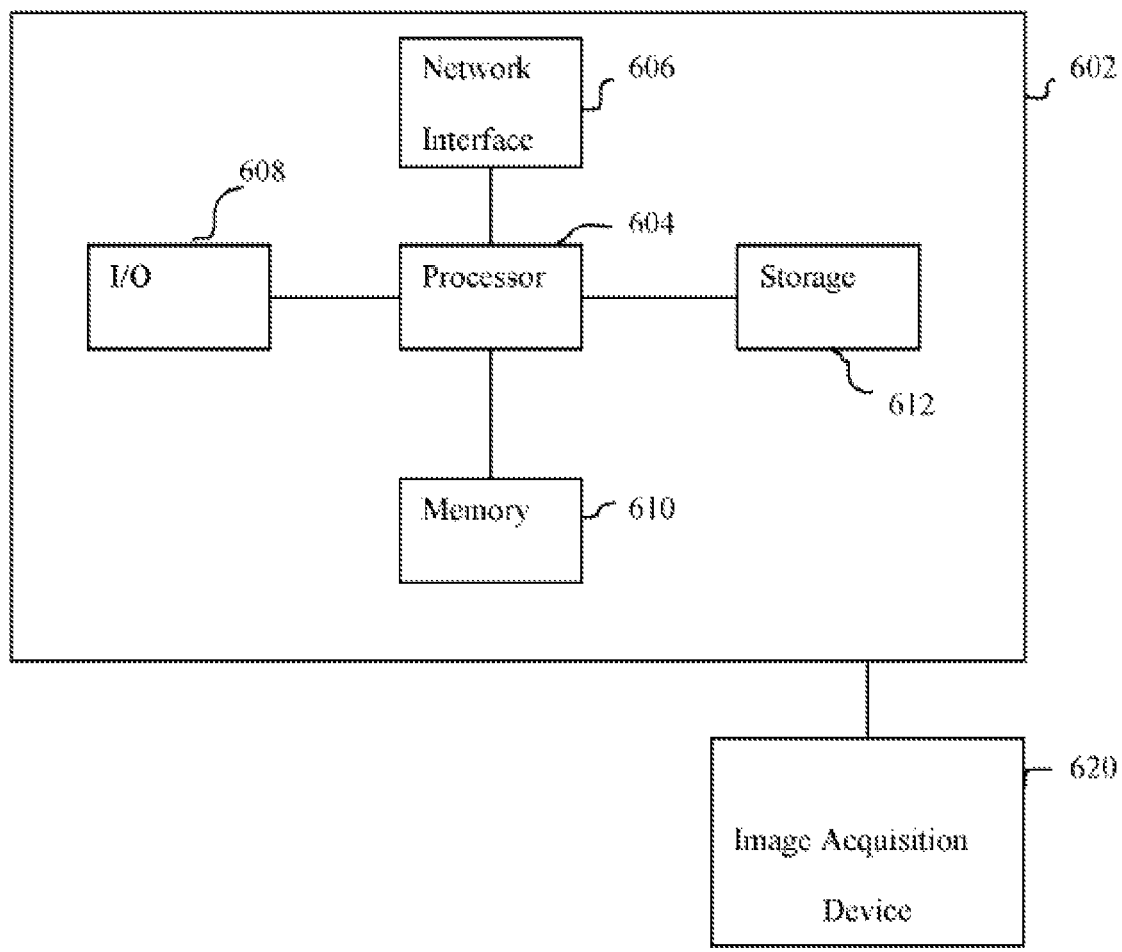

SYSTEM AND METHOD FOR LEARNING BASED MAGNETIC RESONANCE FINGERPRINTING

CROSS-REFERENCE TO RELATED APPLICATION

This application claims priority under 35 U.S.C. § 119(e) to U.S. Provisional Application Ser. No. 62/264,774, filed Dec. 8, 2015, the contents of which are incorporated herein by reference.

FIELD

The present disclosure relates in general to an improved magnetic resonance fingerprinting.

BACKGROUND

Magnetic resonance fingerprinting (MRF) is a recently proposed technique for multi-parametric quantitative magnetic resonance imaging (MRI). In MRF, by using a specifically designed magnetic resonance (MR) sequence, for different tissue types with different MR physiological parameters such as $T_1$ (the longitudinal relaxation time) and $T_2$ (the transverse relaxation time), distinctive signal evolutions (fingerprints) are generated. The unique signals can then be processed to recover the tissue types, with simultaneous estimation of multiple parameters such as $T_1$ and $T_2$.

The MRF process can be divided into two steps: acquiring signal evolutions and estimating tissue parameters. For the signal acquisition, to achieve the prerequisite that different tissue types will generate distinctive signals, currently the MRF sequences use empirically randomized or pseudo-randomized flip angles (FA) and repetition times (TR) without optimization. On the other hand, several studies have implied that different sequences offer different levels of the final parameter estimation accuracy.

In the currently practiced MRF reconstruction processes, dictionary matching is used for the tissue parameter estimation. A dictionary is first built for a specific MR sequence and a set of possible tissue parameters. Each entry in the dictionary is generated by Bloch equation simulation, or other simulation methods such as extended phase graphs, of the signal of a certain tissue type under the MR sequence excitation (MR signal response). The signal from one voxel of the acquired images is then searched in the dictionary to find the closest match. And the matched tissue (with the multiple parameters) is assigned directly to the spatial location. The dictionary matching is subject to quantization error since only a finite number of tissues are included in the dictionary. The dictionary matching is also a time consuming process and will become a more serious issue as iterative reconstruction, finer gridded parameter space, and more complex physiological models are used. Further, aliasing artifacts due to under-sampling in the Fourier space and noise in the Fourier coefficients require the matching to be robust.

Accordingly, there is a need in the art for improved MRF reconstruction process.

SUMMARY

According to an aspect of the present disclosure, a learning-based MRF reconstruction method for reconstructing an MR image of a tissue space in an MR scan subject for a particular MR sequence is disclosed. The method comprises:

(a) acquiring a set of MR signal evolutions from an MR scanner;
(b) inputting a single MR signal evolution from the acquired MR signal evolutions to a machine-learning algorithm; and
(c) generating a set of tissue parameters corresponding to a voxel represented by the single MR signal evolution using said machine-learning algorithm based on the single MR signal evolution;

wherein the machine-learning algorithm estimates the tissue parameter from the acquired MR signal evolution without using a dictionary or dictionary matching.

According to another aspect, a learning-based MRF reconstruction method for reconstructing an MR image of a tissue space in an MR scan subject for a particular MR sequence is disclosed. The method comprises:

(a) acquiring a set of MR signal evolutions from an MR scanner for an MR image;
(b) inputting the set of acquired MR signal evolutions to a machine-learning algorithm; and
(c) generating an array of sets of tissue parameters corresponding to an MR image represented by the set of acquired MR signal evolutions using said machine-learning algorithm based on the acquired set of MR signal evolutions;

wherein the machine-learning algorithm estimates the array of sets of tissue parameters from the acquired set of MR signal evolutions without using a dictionary or dictionary matching.

BRIEF DESCRIPTION OF THE DRAWINGS

The following will be apparent from elements of the FIGURE, which are provided for illustrative purposes. The FIGURE are schematic and are not necessarily to scale.

FIG. 1 illustrates a high-level schematic block diagram of a computer through which the embodiments of the method of the present disclosure can be implemented is illustrated.

DETAILED DESCRIPTION

This description of the exemplary embodiments is intended to be read in connection with the accompanying drawings, which are to be considered part of the entire written description.

Disclosed herein is a method of using machine learning-based techniques to improve MRF reconstruction. According to an aspect, the disclosed machine learning-based method solves the inverse reconstruction problem in MRF, where the measured signals are mapped to the tissue parameter space using a machine-learned mapping algorithm. During MRF reconstruction, the acquired voxel signal is fed into a machine-learned mapping algorithm and direct parameter estimation is provided, without the need of dictionary or dictionary matching. Because the improved process does not involve dictionary matching, the new process can perform MRF reconstruction much faster than the current dictionary matching method and a continuous parameter output can be achieved.

In the training session for the machine-learned mapping algorithm, the method learns on a predefined training data consisting of sampled points in the tissue parameter space and the corresponding MR signal evolutions simulated using Bloch equations following a specific MR sequence.

In the testing phase of a non-iterative MRF technique, after inverse Fourier transform (and coil sensitivity maps), the machine-learned mapping is applied to the acquired voxel signal evolutions to obtain the corresponding tissue parameters. In the testing phase of an iterative MRF technique, the tissue parameters estimated using the machine-learned mapping are then fed into a Bloch simulation to generate the corresponding MR signal response, which is then used in the next iteration of reconstruction. By turning the original problem into a regression problem, more accurate parameter map and the corresponding MR signal response can be reconstructed. MRI generates signals by applying a series of radio frequency (RF) excitations to manipulate the object nuclear magnetization and records the responses of the object to the series of excitations. "MR signal response" herein refers to the varying magnetization (the responses) can be calculated using a set of macroscopic equations, the so-called Bloch equations, which describes the magnetization behavior through time as a function of the RF excitation, relaxation times (T1 and T2 etc.) and so on.

According to another aspect of the present disclosure a machine learning-based method for obtaining the MR signal response from a certain tissue directly from the measured signal, without dictionary matching and Bloch simulation, is disclosed. MR signal response from a certain tissue is needed in iterative MRF reconstruction, and in the conventional dictionary matching method the MR signal response is simply treated as the matched atom signal in the dictionary. The machine learning-based method of the present disclosure can directly estimate the MR signal response without the time-intensive matching step. In addition, this assists the iterative MRF reconstruction method by driving the data fidelity closer to its true minimum, instead of only approaching a bounded minimum defined by the manifold of the dictionary.

In another aspect, a machine learning-based method for obtaining the tissue parameters and the corresponding MR signal response simultaneously from the acquired signal evolution, without dictionary matching and Bloch simulation, is disclosed.

According to another aspect, a learning-based method for solving the inverse problem in MRF with spatial information is also disclosed. The testing process can take whole MRF images as input and output the tissue parameters for the whole spatial object. The training process can be performed on whole MRF images rather than one voxel at a time. The method can learn on synthesized MRF images which include the effect of under-sampling, noise and spatial correlation, with known ground truth parameter maps. The MRF reconstruction process is as described above, however, by using whole MRF image data, spatial information, aliasing artifacts due to undersampling and noise are also learned. Thus increased parameter estimation accuracy can be achieved.

Any of several techniques may serve the purpose of the machine learning-based methods, including kernel methods (e.g. support vector machine), ensemble methods (e.g. random forest) and deep learning methods (e.g. convolutional neural networks, stacked autoencoders).

Matching the signal from a single spatial location to estimate its associated parameters could yield noisy estimation even for neighboring locations. There are two ways to further reduce such noise in the Bloch estimation: (A) In one method, once the parameters are estimated for each spatial location, a global prior constraint (such as smallest total variation, sparsity, smoothness in L2 sense, etc.) can be used to further regularize the final tissue parameter estimation for the whole MRF image. This can be formulated using, for example, a Markov Random Field framework; (B) In another method, rather than using the signal from a single spatial location, one can stack all signals from a small neighborhood around the single location and use this stacked signal to perform matching. The learned parameter value can be for a single voxel or a stack of voxels. This brings more reliable parameter estimation as more observations are used.

The various embodiments of the method described herein can be applied as a component in a larger reconstruction system by serving the methods as building blocks in an iterative MRF reconstruction.

According to an aspect of the present disclosure, a learning-based MRF reconstruction method for reconstructing an MR image of a tissue space in an MR scan subject for a particular MR sequence is disclosed. An MR scan subject can be a human (e.g. a patient), a test phantom, or an animal. The method comprising: (1a) acquiring a set of MR signal evolutions from an MR scanner; (1b) inputting a single MR signal evolution from the acquired MR signal evolutions to a machine-learning algorithm; and (1c) generating a set of tissue parameters using said machine-learning algorithm based on the single MR signal evolution; wherein the machine-learning algorithm estimates the tissue parameter from the acquired MR signal evolution without using a dictionary or dictionary matching. The set of tissue parameters generated by the machine-learning algorithm in step (1c) corresponds to a voxel in the tissue space represented by (i.e. associated with) the single MR signal evolution.

In some embodiments of the method, the machine-learning algorithm is one of artificial neural networks, support vector machines, linear regression, logistic regression, naïve Bayes, linear discriminant analysis, decision trees, and k-nearest neighbor algorithm, that has been trained to estimate MR signal evolution when given a set of tissue parameters.

In some embodiments of the method, the machine-learning algorithm is a trained artificial neural network (ANN). In some embodiments, the ANN has been trained in a training session with supervised learning process (a machine learning process) using a predefined training data consisting of (A) a plurality of tissue parameter sets representing sampled points in a tissue parameter space, (B) their corresponding simulated MR signal evolutions (i.e., fingerprints) obtained by Bloch equation simulation following the particular MR sequence for the MRF scan, and/or (C) their corresponding MR signal evolutions obtained by Bloch equations with noise added (artificial artifacts, mimicking real acquisition noise) to be more realistic. The training session comprises inputting a plurality of pairs of the simulated MR signal evolutions and the corresponding sampled points in the tissue parameter space as input/output pairs into the ANN. Preferably, as many input/output pairs of data points as practicable is used for the training as that would produce more accurate ANN. The simulation of the MR signal evolutions mentioned in (B) above is not limited to one particular simulation method. One skilled in the art would know that the simulation can be obtained by one of many methods such as Bloch equation simulation and extended phase graphs.

In some embodiments, the MR signal evolutions used in the training session are continuously simulated in parallel with the training session thus continuously generating new training data.

In the supervised learning training process, known "signal" and "tissue parameter" input/output pairs generated from the plurality of sampled points are input to the ANN so that the ANN learns the functional relationship between the input/output pairs so that the ANN can generate tissue parameters when given a measured MR signal evolution. Referring to the training data (A), (B), and (C) described above, the input/output pairs can be (B, A), (C, A), or both. In other words, the ANN has only one input, but it can be trained to work well on both noisy input (C) and noiseless inputs (B). The plurality of sampled points in the tissue parameter space can be selected in any manner but in some embodiments, they are preferably selected at random. In order for the learning-based MRF reconstruction method of the present disclosure to be applied and used for the various MR sequences available, the ANN needs to be trained for each of the MR sequences using training data consisting of a plurality of sampled points in a tissue parameter space and their corresponding MR signal evolutions simulated using Bloch equations that corresponds to each of the MR sequences. Preferably, Since the training data are synthesized, the training data can be generated on the fly. Rather than splitting the training process into two consecutive steps of first gathering the training data, then running the training of the ANN, new training data can be generated in parallel with training of the ANN. Such embodiment will allow each training iteration to be always performed on a new training data.

In some embodiments, the method is part of an iterative MRF reconstruction process and the set of tissue parameters generated by the machine-learning algorithm is inputted into a simulation process to generate a corresponding MR signal response. In some embodiments, the MR signal response can be simulated using Bloch equation simulation. In other embodiments, the MR signal response can be simulated using extended phase graphs.

In some embodiments, the method further comprises a step of inputting the MR signal response into a subsequent iteration of MRF reconstruction.

In some embodiments of the method, the steps (1b) through (1c) are repeated for every voxel in the MR image being reconstructed by the MRF reconstruction.

In some embodiments of the method, for each voxel, a global prior constraint selected from the group consisting of smallest total variation, sparsity, and smoothness in L2sense is used to further regularize the tissue parameter estimation for the MR image. In some embodiments, the regularization is formulated using a Markov Random Field framework.

In some embodiments, the method further comprises: stacking additional MR signal evolutions for additional voxels around said voxel in the MR scan subject's tissue space; and inputting the stacked additional MR signal evolutions to the machine-learning algorithm to generate the set of tissue parameters for the stacked MR signal evolutions.

In some embodiments, the ANN has been further trained to generate both the set of tissue parameters and the corresponding MR signal response simultaneously without the use of dictionary or dictionary matching. The further training uses supervised learning process and comprises inputting a plurality of pairs of training data set as input/output pairs into the ANN, wherein each training data set consists of the simulated MR signal evolution and the corresponding MR signal response, wherein the corresponding MR signal response is generated by inputting a plurality of sets of tissue parameters generated by the ANN into a simulation process (e.g., Bloch equation simulation, extended phase graphs, etc.). As mentioned above, preferably, as many training data sets as practicably possible should be used because a supervised learning process will produce more accurate ANN when more training data sets are used.

According to another aspect, another embodiment of a learning-based MRF reconstruction method for reconstructing an MR image of a tissue space in an MR scan subject for a particular MR sequence is disclosed. The method comprises: (2a) acquiring a set of MR signal evolutions from an MR scanner for an MR image; (2b) inputting the set of acquired MR signal evolutions to a machine-learning algorithm; and (2c) generating an array of sets of tissue parameters corresponding to an MR image represented by (i.e., corresponding to) the set of acquired MR signal evolutions using said machine-learning algorithm based on the acquired set of MR signal evolutions. The machine-learning algorithm estimates the array of sets of tissue parameters from the acquired set of MR signal evolutions without using a dictionary or dictionary matching.

In some embodiments, said machine-learning algorithm is one of artificial neural networks, support vector machines, linear regression, logistic regression, naïve Bayes, linear discriminant analysis, decision trees, and k-nearest neighbor algorithm, that has been trained to estimate MR signal evolution when given a set of tissue parameters.

In some embodiments, said machine-learning algorithm is a trained artificial neural network (ANN).

In some embodiments, the ANN has been trained in a training session with a supervised learning process using a predefined training data consisting of a plurality of sets of a plurality of sampled points in a tissue parameter space and their corresponding MR signal evolutions simulated using Bloch equations following said particular MR sequence, wherein the plurality of sets of a plurality of sampled points represent a whole MR image, wherein the training comprises inputting the input/output pair of the simulated MR image and the corresponding sets of a plurality of sampled point in the tissue parameter space. As mentioned above, the ANN needs to be trained for each of the MR sequences using the corresponding training data set for each of the MR sequences in order for the learning-based MRF reconstruction method to be applied and used for the various MR sequences available.

In another embodiment, the MR signal evolutions used in the training session are continuously simulated in parallel with the training session thus continuously generating new training data.

In some embodiments, the method is part of an iterative MRF process and said array of sets of tissue parameters generated by the machine-learning algorithm is inputted into a simulation process (e.g., Bloch equation simulation, extended phase graphs, etc.) to generate a corresponding MR signal response.

In some embodiments, the method further comprises a step of inputting the MR signal response into a subsequent iteration of MRF reconstruction.

A high-level block diagram of a computer through which the embodiments of the method of the present disclosure can be implemented is illustrated in FIG. 1. Computer 602 contains a processor 604, which controls the overall operation of the computer 602 by executing computer program instructions which define such operation. The computer program instructions may be stored in a data storage device 612 (e.g., SSD, magnetic disk, etc.) and loaded into memory 610 when execution of the computer program instructions is desired. Thus, the steps of the methods may be implemented by the computer program instructions stored in the memory 610 and/or storage 612 and controlled by the processor 604 executing the computer program instructions. An image acquisition device 620, such as a MR scanner, can be connected to the computer 602 to input acquired image data to the computer 602. It is possible to implement the image acquisition device 620 and the computer 602 as one device. It is also possible that the image acquisition device 620 and the computer 602 communicate wirelessly through a network. The computer 602 also includes one or more network interfaces 606 for communicating with other devices via a network. The computer 602 also includes other input/output devices 608 that enable user interaction with the computer 602 (e.g., display, keyboard, mouse, speakers, buttons, etc.). Such input/output devices 608 may be used in conjunction with a set of computer programs as an annotation tool to annotate volumes received from the image acquisition device 620. One skilled in the art will recognize that an implementation of an actual computer could contain other components as well, and that FIG. 1 is a high level representation of some of the components of such a computer for illustrative purposes.

Once the ANN in the MR apparatus has been trained, the ANN can be used to produce the tissue parameters The description of the various embodiments is provided to enable any person skilled in the art to practice the disclosure. The various modifications to these embodiments will be readily apparent to those skilled in the art, and the generic principles defined herein may be applied to other embodiments without the use of inventive faculty. The present disclosure is not intended to be limited to the embodiments shown herein, but is to be accorded the widest scope consistent with the principles and novel features disclosed herein.

What is claimed is:

1. A learning-based magnetic resonance fingerprinting (MRF) reconstruction method for reconstructing a magnetic resonance (MR) image of a tissue space comprising a plurality of voxels in an MR scan subject for a particular MR sequence, the method comprising:
   (a) acquiring a set of MR signal evolutions from an MR scanner;
   (b) inputting, for each voxel in the plurality of voxels, a single MR signal evolution representing a voxel of the plurality of voxels to a machine-learning algorithm;
   (c) generating a set of tissue parameters for each respective voxel using the machine-learning algorithm based on the acquired set of MR signal evolutions; and
   (d) reconstructing an MR image of the tissue space using the plurality of voxels and respective tissues parameters for each voxel of the plurality of voxels;
   wherein the machine-learning algorithm estimates the tissue parameter from the acquired MR signal evolution without using a dictionary or dictionary matching.

2. The method of claim 1, wherein said machine-learning algorithm is one of artificial neural networks, support vector machines, linear regression, logistic regression, nave Bayes, linear discriminant analysis, decision trees, and k-nearest neighbor algorithm, that has been trained to estimate MR signal evolution when given a set of tissue parameters.

3. The method of claim 1, wherein said machine-learning algorithm is a trained artificial neural network (ANN).

4. The method of claim 3, wherein the ANN has been trained in a training session with a supervised learning process using a predefined training data consisting of a plurality of tissue parameter sets representing sampled points in a tissue parameter space and their corresponding simulated MR signal evolutions following said particular MR sequence, wherein the training session comprises inputting a plurality of pairs of the simulated MR signal evolutions and the corresponding sampled points in the tissue parameter space as input/output data pairs into the ANN.

5. The method of claim 4, wherein the MR signal evolutions used in the training session are continuously simulated in parallel with the training session thus continuously generating new training data.

6. The method of claim 1, wherein the method is part of an iterative MRF process and the method further comprises inputting said set of tissue parameters generated by the machine-learning algorithm into a simulation process to generate a corresponding MR signal response.

7. The method of claim 6, further comprising a step of inputting the MR signal response into a subsequent iteration of MRF reconstruction.

8. The method of claim 1, wherein the steps (b) through (c) are repeated for every voxel in the MR image being reconstructed by the MRF reconstruction.

9. The method of claim 1, wherein for each voxel, a global prior constraint selected from the group consisting of smallest total variation, sparsity, and smoothness in L2 sense is used to further regularize the tissue parameter estimation for the MR image.

10. The method of claim 9, wherein the regularizing is formulated using a Markov Random Field framework.

11. The method of claim 1, further comprising stacking additional MR signal evolutions for additional voxels around said voxel; and
   inputting the stacked additional MR signal evolutions to the machine-learning algorithm to generate the set of tissue parameters for the stacked MR signal evolutions.

12. The method of claim 4, wherein the ANN has been further trained to generate both said set of tissue parameters and corresponding MR signal response simultaneously without using a dictionary or dictionary matching,
   wherein the further training comprises inputting a plurality of pairs of training data set as input/output pairs into the ANN, wherein each training data set consists of said simulated MR signal evolution and the corresponding MR signal response,
   wherein the corresponding MR signal response is generated by inputting a plurality of sets of tissue parameters generated by the ANN into a simulation process.

13. A learning-based magnetic resonance fingerprinting (MRF) reconstruction method for reconstructing a magnetic resonance (MR) image of a tissue space comprising a plurality of voxels in an MR scan subject for a particular MR sequence, the method comprising:
   (a) acquiring a set of MR signal evolutions from an MR scanner for an MR image;
   (b) inputting, for each voxel in the plurality of voxels, the set of acquired MR signal evolutions to a machine-learning algorithm;
   (c) generating an array of sets of tissue parameters corresponding to the MR image represented by the set of acquired MR signal evolutions using the said machine-learning algorithm based on the acquired set of MR signal evolutions; and
   (d) reconstructing an MR image of the tissue space using the plurality of voxels and respective tissues parameters for each voxel of the plurality of voxels;
   wherein the machine-learning algorithm estimates the array of sets of tissue parameters from the acquired set of MR signal evolutions without using a dictionary or dictionary matching.

14. The method of claim 13, wherein said machine-learning algorithm is one of artificial neural networks, support vector machines, linear regression, logistic regression, nave Bayes, linear discriminant analysis, decision trees, and k-nearest neighbor algorithm, that has been trained to estimate MR signal evolution when given a set of tissue parameters.

15. The method of claim 13, wherein said machine-learning algorithm is a trained artificial neural network (ANN).

16. The method of claim 15, wherein the ANN has been trained in a training session with a supervised learning process using a predefined training data consisting of multiple sets of a plurality of tissue parameter sets representing sampled points in a tissue parameter space and their corresponding MR signal evolutions simulated using Bloch equations following said particular MR sequence,
- wherein the plurality of sets of a plurality of sampled points represent a whole MR image,
- wherein the training comprises inputting a plurality of pairs of the simulated MR image and the corresponding sets of a plurality of sampled points in the tissue parameter space as input/output data pairs into the ANN.

17. The method of claim 16, wherein the MR signal evolutions used in the training session are continuously simulated in parallel with the training session thus continuously generating new training data.

18. The method of claim 15, wherein the method is part of an iterative MRF process and said array of sets of tissue parameters generated by the machine-learning algorithm is inputted into a simulation process to generate a corresponding MR signal response.

19. The method of claim 18, further comprising a step of inputting the MR signal response into a subsequent iteration of MRF reconstruction.

* * * * *